United States Patent
Machimura et al.

(10) Patent No.: US 7,047,363 B2
(45) Date of Patent: May 16, 2006

(54) CACHE MEMORY AND CONTROL METHOD THEREOF

(75) Inventors: Hiroki Machimura, Kanagawa (JP); Junichiro Minamitani, Kanagawa (JP)

(73) Assignee: Nec Electronics Corporation, Kanagawa (JP)

( * ) Notice: Subject to any disclaimer, the term of this patent is extended or adjusted under 35 U.S.C. 154(b) by 321 days.

(21) Appl. No.: 10/615,870

(22) Filed: Jul. 10, 2003

(65) Prior Publication Data

US 2004/0008552 A1 Jan. 15, 2004

(30) Foreign Application Priority Data

Jul. 12, 2002 (JP) ............................. 2002-204107

(51) Int. Cl.
*G06F 12/08* (2006.01)

(52) U.S. Cl. ...................................... 711/128; 711/144

(58) Field of Classification Search ................ 711/128, 711/144
See application file for complete search history.

(56) References Cited

FOREIGN PATENT DOCUMENTS

JP          2-90348          3/1990

*Primary Examiner*—Hiep T. Nguyen
(74) *Attorney, Agent, or Firm*—McGinn IP Law Group, PLLC (57) ABSTRACT

A cache memory related to the present invention is a cache memory employing a set associative system, for generating a valid bit for showing the presence of validity of a cache data, and comprises a tag memory 1 for storing an address tag of an address of a cache data and a first valid bit for showing the presence of validity of the cache data in a set of blocks in response to an index, and a valid bit register 2 for storing a second valid bit corresponding to the first valid bit, and resetting the second valid bit, and the valid bit is generated based on the first valid bit and the second valid bit.

14 Claims, 4 Drawing Sheets

CACHE MEMORY AND CONTROL METHOD THEREOF

BACKGROUND OF THE INVENTION

The present invention relates to a cache memory and a control method thereof, and specifically, to a cache memory employing a set associative system and a control method thereof.

Conventionally, a cache memory is arranged especially between a processor and a high-capacity and low-speed main memory, and stores commands, data and so forth which are frequently accessed, and thereby, shortens access time of an entire system. For such a cache memory that shortens the access time of the entire system, a set associative system is widely being used, in which a plurality of places where each block is allocatable exist in order to improve a hit rate of the data.

In the cache memory employing this set associative system, a storage region of the memory is divided into a plurality of sets, and an address tag of a data is stored for each set in a tag memory. And, the address tag read from the tag memory is compared with an access address, and a hit/miss-hit signal is generated from a comparison result, and the data memory in which the data is stored is accessed.

Usually, in each block of the tag memory, together with the tag address, a valid bit (a valid bit) for showing whether the contents of the data memory corresponding to the address is valid or invalid is stored. When the tag address read from the tag memory is compared with the access address, the valid bit is read for every way of each set. And, in case that, as a result of the comparison, both addresses coincide with each other, and a way for which the valid bit shows "validity" exists, access to the data memory becomes possible.

The cache memory employing such a set associative system is widely being used for generally making a function of a processor higher. And, in recent years, it is required that flash of the cache memory employing the set associative system is performed one clock.

As a technology for performing the flash of the cache memory employing the set associative system one clock, JP-P1990-90348A is disclosed. In a cache memory employing the set associative system of JP-P1990-90348A, the tag address is divided from a valid bit register for storing a valid bit therein, and by means of memory means for memorizing the valid bit, all clear operation at one cycle is conducted.

However, in case of employing the set associative system having an n-way/k-set arrangement in the cache memory of JP-P1990-90348A, the number of the valid bit registers becomes $n \times 2^k$, and a circuit scale of the cache memory increases. And, in association with the increase of the circuit scale of the cache memory, electric power consumption consumed in the cache memory increases. Specifically, in association with the increase of a way number, the circuit scale infinitely increases, and in association therewith, the electric power consumption infinitely increases.

Further, if the number of the valid bit registers becomes greater, in performing write into the cache memory and read from the cache memory, a control circuit for selecting the valid bit registers becomes complicated. Accordingly, there is a task that a time period necessary for the writing into and reading from the valid bit increases, and the speed of the cache memory becomes lower.

As described, in the conventional cache memory, there is a task that, even though clear operation can be performed, the circuit scale of the cache memory itself is enlarged.

SUMMARY OF THE INVENTION

The present invention was made to solve such a task, and the objective thereof is to provide a cache memory capable of performing the clear operation efficiently and reducing the circuit scale, and a control method thereof.

A cache memory related to the present invention is a cache memory employing a set associative system, for generating a valid bit for showing presence of validity of a cache data, and comprises storage for storing an address tag of an address of a cache data and a first valid bit for showing presence of validity of said cache data in a set of blocks in response to an index (a tag memory 1 in an embodiment of the present invention, for example), and reset means for storing a second valid bit corresponding to said first valid bit, and resetting said second valid bit (a valid bit register 2 in an embodiment of the present invention, for example), and said valid bit is generated based on the first valid bit and the second valid bit. By means of such an arrangement, the clear operation of the cache memory can be performed efficiently via the first valid bit and the second valid bit.

Further, in the cache memory related to the present invention, said valid bit shows validity in case that both of the first valid bit and the second valid bit show validity, and shows invalidity in case that either the first valid bit or the second valid bit shows invalidity. Accordingly, the second valid bit shows invalidity, and thereby, said valid bit can show invalidity, and the clear operation of the cache memory can be performed efficiently.

Furthermore, in the cache memory related to the present invention, said reset means is common to each way. Accordingly, the number of the reset means can be decreased, and the circuit scale of the cache memory can be reduced.

And, in the cache memory related to the present invention, in case that said reset means resets the second valid bit, said first valid bit is cleared via write means (logic gates OR91–9n, 101–10n and a valid bit signal 320 in an embodiment of the present invention, for example) for writing the first valid bit into first storage. Accordingly, the clear operation of the first valid bit can be performed while the circuit scale of the cache memory is reduced more.

Also, in the cache memory related to the present invention, said first valid bit is selectively cleared via the write means. Accordingly, the clear operation of the first valid can be partially performed easily.

A control method related to the present invention is a control method of controlling a reset of a cache memory employing a set associative system, for generating a valid bit for showing presence of validity of a cache data, and comprises steps of storing an address tag of an address of a cache data and a first valid bit for showing presence of validity of said cache data in a set of blocks in response to an index, storing a second valid bit in response to said index, resetting said second valid bit, and generating said valid bit based on said first valid bit and said second valid bit. By means of such a method, the clear operation of the cache memory can be performed efficiently via the first valid bit and the second valid bit.

Further, in the control method related to the present invention, said valid bit shows validity in case that both of the first valid bit and the second valid bit show validity, and shows invalidity in case that either the first valid bit or the second valid bit shows invalidity. Accordingly, the second valid bit shows invalidity, and thereby, said valid bit can show invalidity, and the clear operation of the cache memory can be performed efficiently.

And, in the control method related to the present invention, in case that the second valid bit is reset, the address tag and the first valid bit are stored and said first valid bit is cleared. Accordingly, the clear operation of the first valid bit can be performed while the circuit scale of the cache memory is reduced more.

Also, in the control method related to the present invention, said first valid bit is selectively cleared. Accordingly, the clear operation of the first valid can be partially performed easily.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

Below, embodiments of the present invention will be explained referring to drawings.

First, one comparison example for an embodiment of the present invention will be explained, and then, the embodiment of the present invention will be explained. In addition, in the embodiment of the present invention, a cache memory will be explained as a cache memory employing a multi-way set associative system. Also, the way number of the cache memory can take any number, and hereinafter, it is described as n-way by using a general number n.

Figure 4:
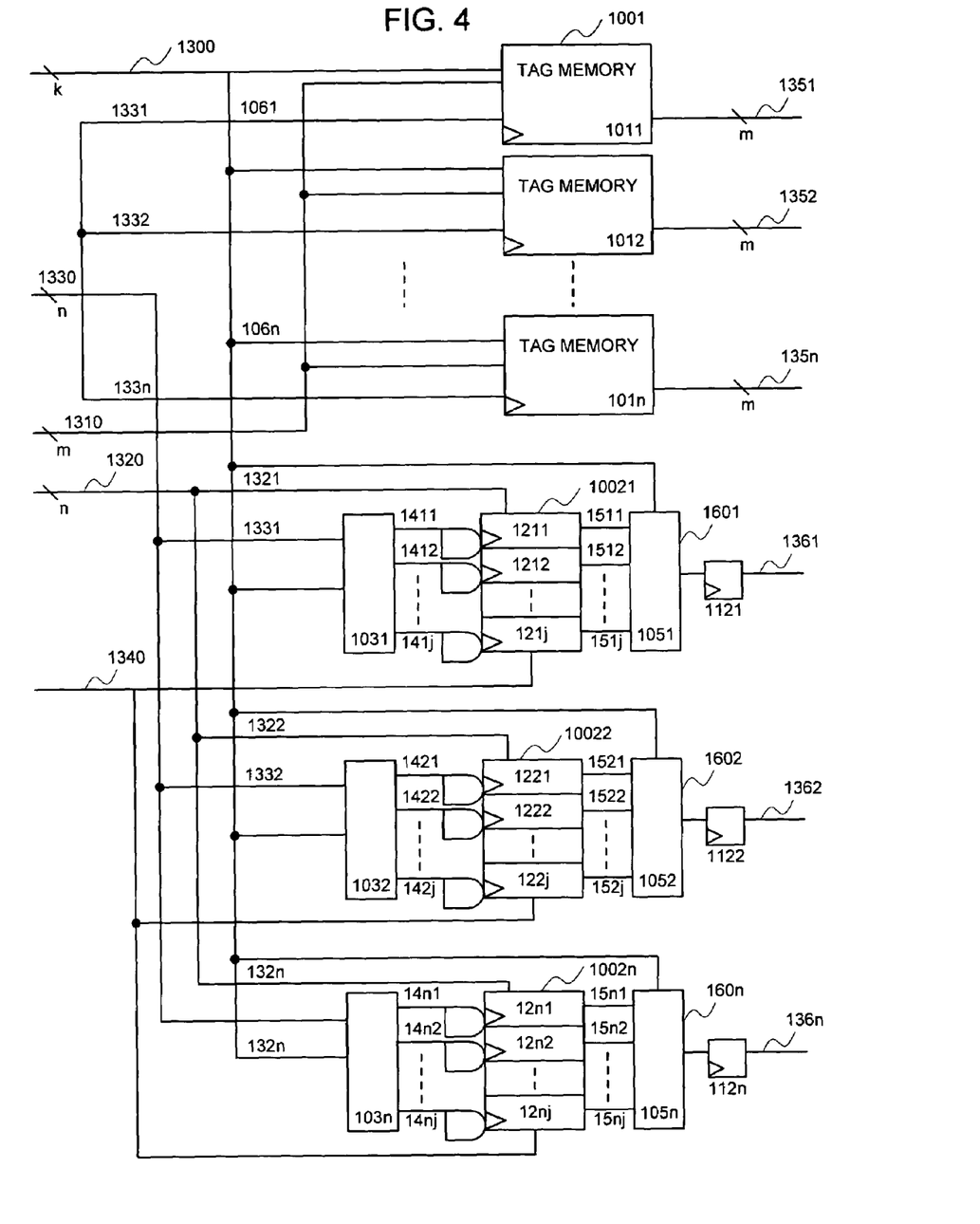

First, using FIG. 4, one comparison example for an embodiment of the present invention (referred to as this embodiment, hereinafter) will be explained. FIG. 4 is a schematic view showing one comparison example for this embodiment. As shown in FIG. 4, a tag memory 1001 is constructed of tag memories 1011–101$n$. To the tag memories 1011–101$n$, an index signal 1300 of k bits and an address tag signal 1310 of m bits are input. When the address tag signal 1310 is input to the tag memories 1011–101$n$, an address tag is written into a set of indexes corresponding to the index signal 1300.

In writing the address tag into the tag memories 1011–101$n$, a write signal 1330 is input. The write signal 1330 falls into write signals 1331–133$n$, and they are input to the tag memories 1011–101$n$, respectively. At this time, the tag memories to which, out of the write signals 1331–133$n$, the write signals having a valid logic value (a logic value 1, for example) were input come into an active state. And, the address tag from the address signal 1310 is written into a set of blocks corresponding to the index signal 1300. Also, the address tag is not written into the tag memories to which, out of the write signals 1331–133$n$, the write signals showing an invalid logic value (a logic value 0, for example) are input.

Also, in one comparison example for this embodiment, which is shown in FIG. 4, different from the cache employing the conventional direct map system or set associative system, a valid bit is not stored in the tag memory 1001 together with the address tag. The valid bit is stored in valid bit registers 10021–1002$n$ separately from the address tag.

Each of the valid bit registers 10021–1002$n$ is constructed of decoders 1031–103$n$, valid bit memories 12$ij$ (i, j=1, ..., n) and encoders 1051–105$n$. The valid bit register 1002$i$ has the valid bit memories 12$i$1–12$ij$. The valid bit of 1 bit is written into each of the valid bit memories 12$ij$.

A valid bit signal 1320 of n bits is input to the valid bit registers 10021–1002$n$, and based on $2^k$ indexes, the valid bit of each address tag of the tag memories 1011–101$n$ is written. At this time, the valid bit signal 1320 falls into valid bit signals 1321 to 132$n$, and they are input to each valid bit register. Also, the index signal 1300 of k bits is input to the valid bit registers 10021–1002$n$. Based on this index signal 1300, the valid bit is written into any one of the valid bit memories 1211–121$j$.

Also, similar to the tag memories 1011–101$n$, in writing the valid bit into the valid bit registers 10021–1002$n$, the write signal 1330 is input. The write signal 1330 falls into the write signals 1331–133$n$, and they are input to each of the decoders 1031–103$n$. At this time, the valid bit memories to which, out of the write signals 1331–133$n$, the write signals having a valid logic value (a logic value 1, for example) were input come into an active state.

The index signal 1300 is input to the decoders 1031–103$n$. Based on this index signal 1300, the decoders 1031–103$n$ perform decodes. Together with this, the write signal having a valid logic value is input to the valid bit memory in which the valid bit will be stored. Accordingly, the valid bit memories to which the write signals were input come into an active state.

With regard to the valid bit memories that came into an active state, any of output signals 14$ij$ is selected based on a decode result in the decoders 1031–103$n$, and the valid bits are stored in the valid bit memories 12$ij$ to which the selected output signals were input. Also, the valid bits are not written into the valid bit memories to which, out of the write signals 1331–133$n$, the write signals showing an invalid logic value (a logic value 0, for example) are input.

In reading the address tag, address tags 1351–135$n$ are read from the tag memories 1011–101$n$ after the index signal 1300 is input to the tag memories 1011–101$n$. At this time, the address tags 1351–135$n$ are read from a set of blocks corresponding to the index signal 1300.

In reading valid bits 1361–136$n$ from the valid bit registers 10021–1002$n$, signals 15$i$1–15$ij$ are output from the valid bit memories 12$i$1–12$ij$ to the encoders 105$i$. The index signal 1300 is input to the encoders 105$i$, and based on this index signal 1300, the signals 15$i$1–15$ij$ to be input are selected.

By means of the selected input signals, the valid bits are read from the valid bit memories corresponding to the selected input signals. Output signals 1601–160$n$ read from the encoders 1051–105$n$ are latched in latches 1121–112$n$, respectively, and are output as the valid bits 1361–136$n$ synchronized with a clock.

The address tags 1351–135$n$ and the valid bits 1361–136$n$ that were output in this manner are sent to a comparator, and are utilized for the comparison with an access address from a CPU. At this time, the valid bits 1361–136$n$ are used for determining the presence of validity of a data to be stored in a data memory. In case that the valid bits 1361–136$n$ show validity (have a logic value 1, for example), the data is being stored in the data memory. Also, in case that the valid bits 1361–136n show invalidity (have a logic value 0, for example), the data will not be stored in the data memory.

In case that the valid bits 1361–136n show validity, the address tags 1351–135n are compared with an access address of a data to which the CPU will have access. Based on a comparison result, in case that both coincide with each other, a hit signal is transmitted to the CPU, and reading of a data from the data memory is performed. In case that the valid bits 1361–136n show invalidity, a mis-nit signal is transmitted to the CPU, and a data for the cache memory is read from a main memory.

In one comparison example for this embodiment, which is shown in FIG. 4, when the validity of a data corresponding to the address tag 135i, which is read from the tag memory 101i, is determined, the valid bit 136i is used. In other words, for example, in the comparator, in case that the valid bit 136i shows validity, the address tag 135i is used for the comparison with the access address. And, in case that both coincide with each other, a data corresponding to the address tag 135i is read.

Also, in one comparison example for this embodiment, when the valid bits stored in the valid bit registers 10021–1002n are cleared to conduct a reset, a flash signal 1340 is input to each valid bit register, and the reset is conducted for each valid bit register. At this time, all valid bits stored in the valid bit memories are cleared at the same time.

As described, in one comparison example for this embodiment, the respective address tags 1351–135n and the respective valid bits 1361–136n correspond to each other one-on-one, and the comparison is conducted with respect to each set (the address tag 135i and the valid bit 136i). Accordingly, in one comparison example shown in FIG. 4, n valid bit registers are provided in the cache memory employing an n-way set associative system. Therefore, even though all of the valid bits can be cleared at the same time, the circuit scale of the cache memory is enlarged. Thereby, the electric power consumption of the cache memory is increased and the speed of the cache memory is lowered.

Next, this embodiment will be explained. In the explanation of this embodiment, the outline, detail and operation of the embodiment will be explained in that order.

Figure 1:
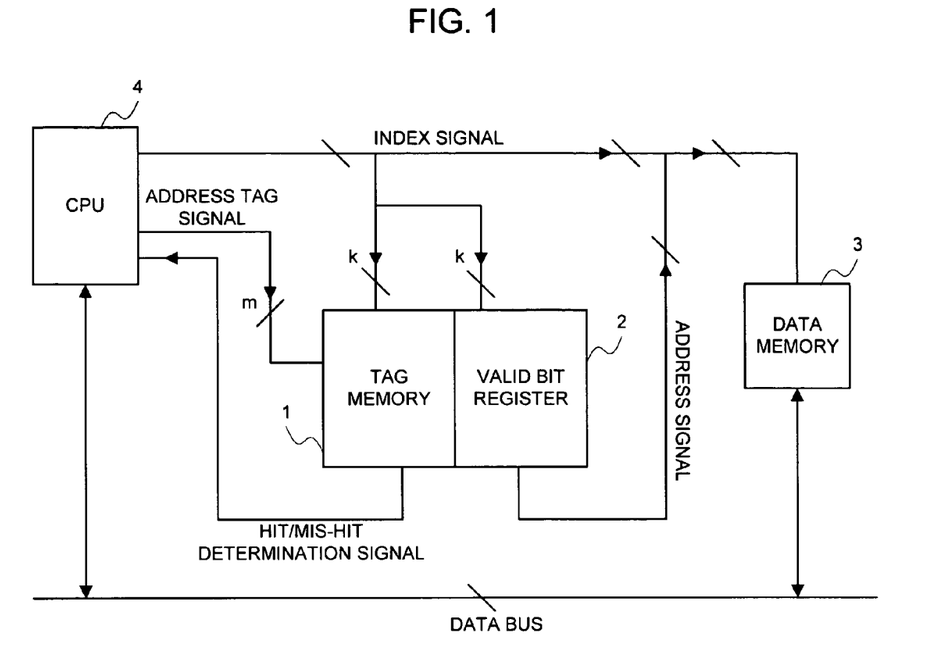
FIG. 1 is a schematic view showing one arrangement example of a system in which a cache memory in an embodiment of the present invention is used.

The outline of this embodiment will be explained using FIG. 1. FIG. 1 is a schematic view showing one arrangement example of a system in which a cache memory in this embodiment is used. As shown in FIG. 1, this system is provided with a CPU (central processing unit) 4, a tag memory 1, a valid bit register 2 and a data memory 3.

The CPU 4 is a general processing device having a command section and a control section. The CPU 4 conducts the transmission of a data and controls the data transmission.

Since the cache memory in this embodiment is a cache memory employing an n-way set associative system, the tag memory 1 is constructed of n-way storage regions. The tag memory 1 stores an address tag for showing a storage position of a data. Further, in the tag memory 1, a valid bit (valid bit) for showing whether the data corresponding to the said address is valid or invalid is stored.

Here, the valid bit shows whether or not the data corresponding to the said address tag is stored in the data memory 3. Also, hereinafter, the valid bit stored in this tag memory 1 is referred to as a first valid bit.

Similar to the tag memory 1, the valid bit register 2 stores a valid bit (Hereinafter, the valid bit stored in the valid bit register 2 is referred to as a second valid bit.) for showing the presence of the validity of a data corresponding to the said address. The valid bit register 2 is, as mentioned later, commonly connected to each set of the n-way of the tag memory 1.

Also, the valid bit register 2 has a decoder for decoding a signal input thereto. As mentioned later, when an index of an address is input to this decoder, a predetermined valid bit signal is selected based on the index, and is stored as the second valid bit signal.

In the cache memory employing the n-way set associative system, the data memory 3 is divided into n kinds of storage regions in response to the n-way of the tag memory 1. In the data memory 3, a data is stored in accordance with an address. This address is corresponding to an address tag stored in the tag memory 1. And, a storage position of the data within the data memory 3 is managed based on the address.

Whether or not the data is stored in the data memory 3 is managed by the first valid bit and the second valid bit. As mentioned later, from the first valid bit and the second valid bit, a valid bit for showing the existence of the data, namely the validity of the data is generated.

As shown in FIG. 1, in this system, from the CPU 4, high m bits of the address are output to the tag memory 1 as an address tag signal. Further, from the CPU 4, low k bits of the address are output to the tag memory 1 and the data memory 3 as an index signal. Also, this index signal is output to the valid bit register 2.

A hit/miss-hit signal for showing a hit/miss-hit of the data is output from the tag memory 1 to the CPU 4. In response thereto, an address tag signal for specifying an address to conduct read and write is output from the tag memory 1 to the data memory 3. Also, between the CPU 4 and the data memory 3, data transmission is conducted via a data bus, and the read and write of the data are performed by means of this address signal.

Figure 2:
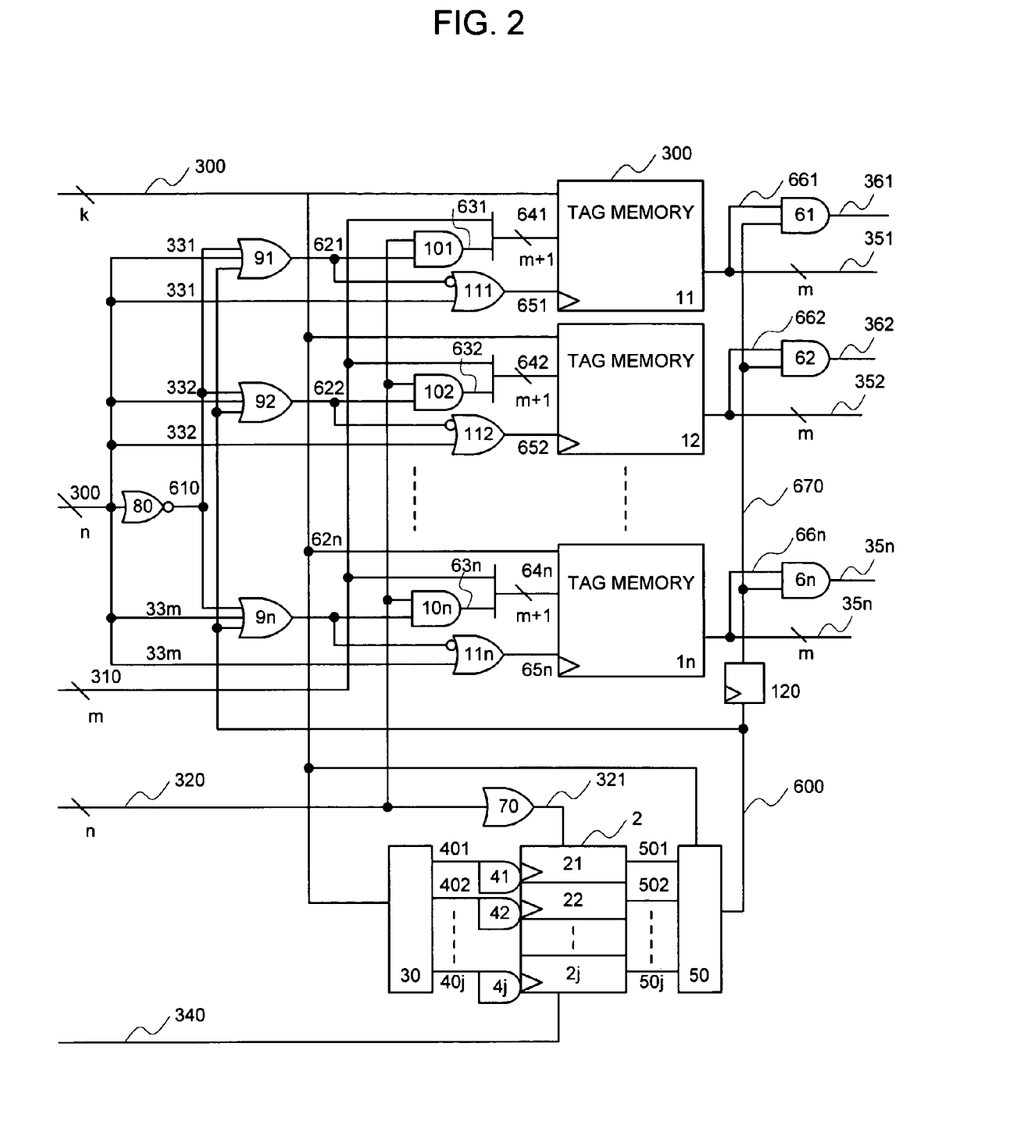
FIG. 2 is a schematic view showing one arrangement example of a main part of the cache memory in an embodiment of the present invention.
Figure 3:
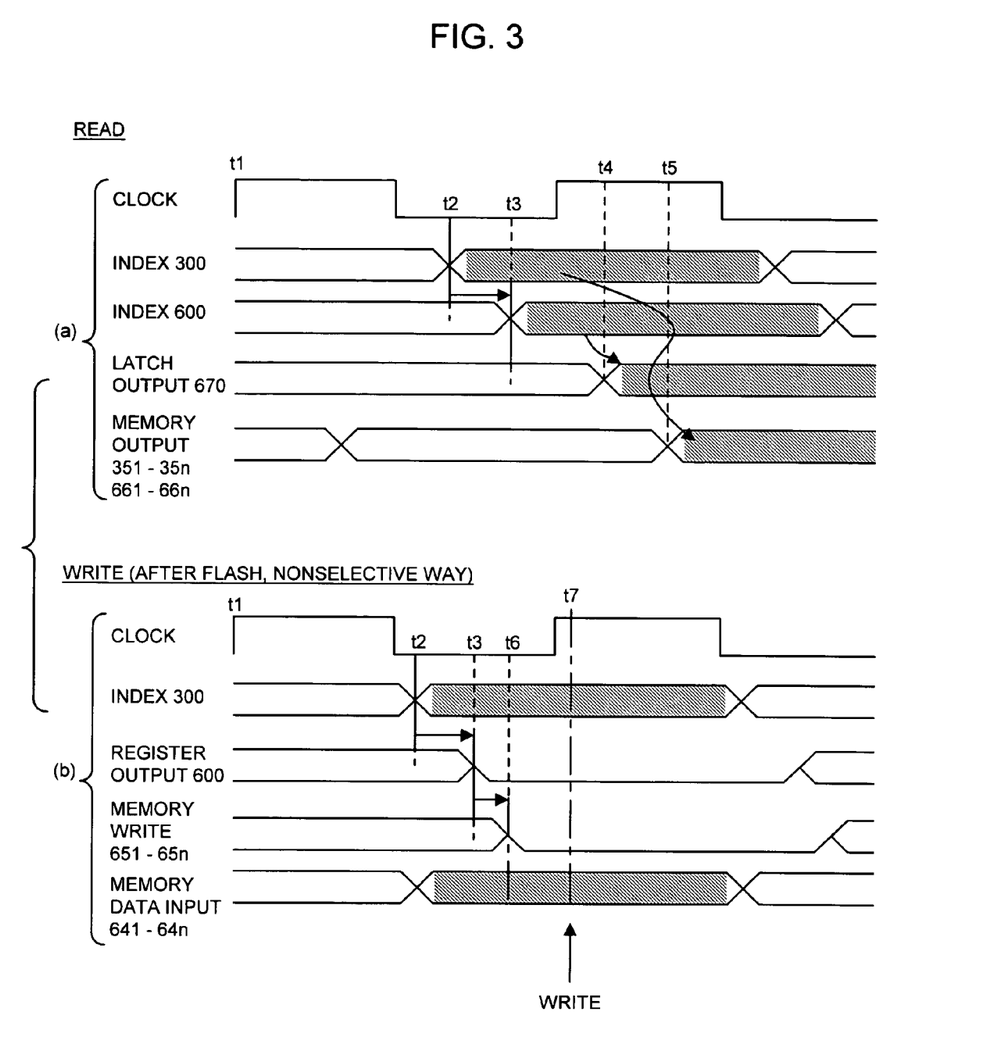
FIG. 3 is a timing chart showing an operation of the cache memory in an embodiment of the present invention and FIG. 4 is a schematic view showing one comparison example for the cache memory in an embodiment of the present invention.

Using FIG. 2 and FIG. 3, the detail of the cache memory in this embodiment will be explained. FIG. 2 is a schematic view showing the tag memory 1 and the valid bit register 2. FIG. 3 is a timing chart showing an operation of the cache memory. In addition, in FIG. 2, only the tag memory 1 and valid bit register 2 related to the present invention of the cache memory employing the n-way set associative system are shown, and a detailed arrangement which is not directly related to the present invention is omitted.

As shown in FIG. 2, the tag memory 1 is constructed of total n tag memories 11–11n of 11–11n, one of which is allocated to 1-way. Also, in each block of the tag memories 11–1n, the address tag and the first valid bit for showing whether the data corresponding to the address tag is valid or invalid are stored. The address tag is a part of an address of each data on a main memory, which is stored in the data memory 3. For example, high m bits of the address can be assumed to be the address tag.

The address tag and the first valid bit to be stored in the tag memories 11–1n are stored in each block based on an index. The index is a part of an address of each data on the main memory, which is stored in the data memory 3. For example, low k bits of the address can be assumed to be the index.

In case that the address tag is high m bits of the address, it is supplied to one of the tag memories 11–1n as the address tag signal 310 of m bits. In case that the index is low k bits of the address, it is supplied to one of the tag memories 11–1n as the index signal 300 of k bits.

When the address tag is read from the tag memories 11–1n, the index signal 300 is input to one of the tag memories 11–1n. Accordingly, a set in which the address tag and the first valid bit are stored is determined, and the address tag is read from this set and is output as address tags 351–35n of m bits.

When the address tag is written into the tag memories 11–1n, the index signal 300 is input to one of the tag memories 11–1n. Accordingly, a set into which the address tag and the first valid bit are written is determined. And, write signals 651–65n are input, and the address tag and the first valid bit are stored in a set of blocks for the tag memory, validity of which is shown out of the write signals 651–65n.

In this manner, in the tag memories 11–1n, the address tag of m bits is stored in each block based on the index of k bits. Accordingly, for 1-way of the tag memories 11–1n, the address tags can be stored in $2^k$ blocks, and for n-way, the address tags can be stored in $n \times 2^k$ blocks. Further, as mentioned later, the first valid bit of 1 bit is added to each address tag, and the address tag is stored together with the first valid bit. In other words, the address tag is stored in a state of (m+1) bits together with the first valid bit. Accordingly, each way of the tag memories 11–1n becomes a memory of (m+1) bits×2k words arrangement.

The first valid bit is stored in each block of the tag memories 11–1n after a valid bit signal 320 of n bits is supplied to the tag memories 11–1n. In a logic gate AND101–10n, a logical product of the valid bit signal 320 of n bits and input signals 621–62n is calculated, and the valid bit signals become first valid bits 631–63n. After the first valid bits 631–63n are added to the address tag signal 310 of m bits, the first valid bits are input to the tag memories 11–1n, respectively, as address tags 641–64n to which the first valid bits are added.

As shown in FIG. 2, the valid bit register 2 is, as a main arrangement, constructed of valid bit memories 21–2j (j=$2^k$ is assumed.) in which the second valid bit is stored, a decoder 30 and an encoder 50.

In the valid bit memories 21–2j, the second valid bit for showing whether a data corresponding to the address tag is valid or invalid is stored. In the valid bit memories 21–2j, the second valid bit is stored based on an index common to each way of each of the tag memories 11–1n, namely, an index of each set, and is stored in response to an index shown by the index signal 300. Also, the valid bit memories 21–2j correspond to j sets, respectively, which correspond to each index in n-way.

A logical sum of the valid bit signal 320 of n bits is calculated in a logic gate OR70, and the valid bit signal is output as a valid bit signal 321 of 1 bit. Further, the index signal 300 is input to the decoder 30 and is decoded, and by means of the results 401–40j of the decode, a logical product thereof is calculated in logic gates AND41–4j. Accordingly, 1 bit of the valid bit signal 321 is stored in one of the valid bit memories 21–2j, which was selected in the logical gates AND41–4j.

Output signals 501–50j output from the valid bit memories 21–2j are input to the encoder 50, and are encoded and output as a register output signal 600. At this time, the index signal 300 is input to the encoder 50, and the register output signal 600 selected out of the output signals 501–50j by means of the index signal 300 is output. Thereafter, the register output signal 600 is latched in a latch 120 to be synchronized with the reading of a data from the memory, and is output as a second valid bit 670.

In logic gates AND61–6n, a logical product of this second valid bit 670 is calculated with first valid bits 661–66n read from each tag memory of the tag memories 11–1n. Thereby, valid bits 361–36n are generated with respect to each way. At this time, the first valid bits 661–66n are output from a set of blocks based on an index corresponding to the register output signal 600 selected by the encoder 50.

Together with these valid bits 361–36n, address tags 351–35n read from the tag memories 11–1n are sent to a comparator not shown in the figures, and are used for address comparison. Also, similar to the first valid bits 661–66n, the tag addresses 351–35n are output from a set of blocks based on the index corresponding to the register output signal 600 selected by the encoder 50.

In the address comparison, first, a valid bit that is valid out of the valid bits 361–36n is selected. And, an address tag having a valid bit that is valid out of the address tags 351–35n is compared with high m bits of an access address to which the CPU is making an access request. As a result of the comparison, in case that both addresses coincide with each other, a hit determination signal which has access to the data memory 3 is generated, and the hit determination signal is transmitted to the data memory 3. Also, in case that both addresses do not coincide with each other, a miss-hit determination signal is generated.

The valid bit register 2 in this embodiment can be constructed as a register having reset means for resetting the valid bit memories 21–2j. In clearing the valid bit memories 21–2j, a rest can be conducted by inputting a flash signal 340 to the valid bit register 2. At this time, by means of 1 clock of the flash signal 340, it is possible to reset all valid bits of the valid bit memories 21–2j at the same time. For example, by inputting a 0 clamp signal or the like of n bits as the flash signal 340, it is possible to clear all of the second valid bits at 1 clock.

As mentioned above, the valid bits 361–36n are generated from the first valid bit 661 and the second valid bit 670. Further, by resetting all of the valid bits of the valid bit memories 21–2j at the same time by means of the valid bit register 2, after the flash, the second valid bit 670 generated from the valid bit register 2 shows invalidity (has a logic value 0, for example). Accordingly, when a logical product is applied to the second valid bit 670 in the logic gates AND61–6n, regardless of the validity/invalidity of the first valid bits 661–66n, the valid bits 361–36n show invalidity. Thereby, when the valid bit register 2 is cleared at 1 clock, it is possible to clear the valid bits 361–36n of each way. Also, since the number of the valid bit register 2 having the reset means is a singular number, compared with the cache memory employing the conventional n-way set associative system, the number of the valid bit registers 2 can be 1/n.

Here, after this flash, valid being stored on the tag memories 11–1n is not cleared while all of the valid bits of the valid bit register 2 are cleared at the same time. Accordingly, in writing the address tag into the tag memory 1 after the flash, logic showing invalidity is written into the first valid bit of a set of blocks that were selected to perform the writing. As one example, a logic value 0 is written into a predetermined first valid bit.

One operation example after the flash will be explained. In addition, hereinafter, 1 in the write signal 330 of the cache memory will be explained as one showing an active state. As shown in FIG. 2, the write signal 330 is reversed after a logical sum is applied to all bits, namely, n bits in a logic gate NOR80, which are consistent with the n-way of the tag memories 11–1n, and is output as a signal 610. In each of logic gates OR91–9n, a logical sum is applied to this signal 610 together with write signals 331–33n to each way and the register output signal 600, and it is output as output signals 621–62n. And, these output signals 621–62n are, after a logical product is applied thereto with the valid bit signal 320 in the logic gate AND101–10n, output as the first valid bits 631–63n.

When all of the valid bit memories 21–2j of the valid bit register 2 are cleared at the same time by the flash signal 340, by means of the flash, the register output signal 600 from the valid bit register 2 becomes 0 that is not active. Further, in order to write the address tag into a set corresponding to the index signal 300, all of the write signals 331–33n are not 0, and out of the write signals 331–33n, there is one that has 1.

In this manner, when the register output signal 600 is 0 and any write signal out of the write signals 331–33n is 1, out of the write signals 331–33n, a write signal that has 1 is input to the tag memory while making any valid bit out of the first valid bits 631–63n 1, which is output from the write signal, and makes the first valid bit 1. Out of the write signals 331–33n, a write signal that has 0 is input to the tag memories 11–1n while making the first valid bits 631–63n 0, and the valid bit becomes 0.

In logic gates OR111–11n, a logical sum is applied to the write signals 331–33n corresponding to each way of the tag memories 11–1n with inversion signals of the output signals 621–62n, and they are output as write signals 651–65n. The write signals 651–65n that were output show validity in case that the address tag and the first valid bit can be written into the blocks of each set. For that, when the write signals 651–65n are 0, the write signals are made valid (For example, 1 is written as a write signal.).

In this manner, the valid bit register 2 has the reset means, and thereby, it is possible to clear all of the second valid bits at the same time at 1 clock, which are stored in the valid bit memories 21–2j. Accordingly, it becomes possible to clear the valid bits 361–36n of each way at 1 clock.

Further, after all of the second valid bits are cleared at the same time, by means of the write signal 330, it is possible to write the address tag into the tag memory 1 and to write a desired first valid bit as 0. Accordingly, after the flash of the valid bit register 2, it is possible to clear all of the second valid bits, and at the same time, to clear all of the first valid bits other than the first valid bits into which the address tag is written.

Also, since, by means of the write signal 330, it is possible to write the address tag into the tag memory 1 and to clear the first valid bit, it is possible to clear the first valid bit without newly providing means for clearing valid bits of the tag memory 1. Accordingly, compared with the comparison example shown in FIG. 4, the circuit scale of the cache memory can be reduced.

Using FIG. 2 and FIG. 3, an operation for reading the address tag from the cache memory and an operation for writing the address tag into the cache memory will be explained in order. Here, in FIG. 3, it is assumed that time $t_1$ is time when a clock signal rises (time when 0 is changed to 1).

(a) part of FIG. 3 is a timing chart showing an operation for reading the address tag from the cache memory. When the address tag is read from the tag memories 11–1n, the index signal 300 of k bits is input to one of the tag memories 11–1n (time $t_2$). Assuming that an index corresponding to this input index signal 300 is an address within the tag memories 11–1n, the address tags 351–35n of m bits are read from each set of blocks of the tag memories 11–1n. At this time, from each block of the tag memories 11–1n, together with the address tags 351–35n, the first valid bits 661–66n of 1 bit are output in synchronization with a clock.

In the valid bit register 2, the index signal 300 is input, and in the encoder 50, one register output signal 600 is selected, and is output from the valid bit register 2 (time $t_3$). The register output signal 600 is latched in the latch 120, and is output as the second valid bit 670 synchronized with a clock (time $t_4$). At this time, via the clock, the second valid bit 670 is synchronized with an output of the first valid bits 661–66n from the tag memories 11–1n. Thereafter, in the logic gates AND61–6n, a logical product is applied to this second valid bit 670 with each of the first valid bits 661–66n output from the tag memories 11–1n, and it is output from each way as the valid bits 361–36n (time $t_5$).

As mentioned above, the address tags 351–35n and the valid bits 361–36n are sent to the comparator, and are used for the address comparison.

(b) part of FIG. 3 is a timing chart showing an operation for writing the address tag into the cache memory. When the address tag is written into the tag memories 11–1n, the write signal 330 of n bits is input. By means of the write signal 330 that was input, the write signals 331–33n corresponding to a way out of the tag memories 11–1n, into which the writing is conducted, are selected, and 1 bit out of the write signals 331–33n becomes active. In other words, 1 bit out of the write signals 331–33n has a valid logic value 1, and all of the write signals 331–33n other than that have an invalid logic value 0.

The index signal 300 of k bits is input to the encoder 50 of the valid bit register 2 (time $t_2$). Based on this index signal 300, one of the output signals 501–50j output from the valid bit memories 21–2j is selected, and is output as the register output signal 600 (time $t_3$)

Also, at the time $t_2$, the address tag signal 310 of m bits is input as an input data to the tag memories 11–1n. 1 bit corresponding to the first valid bit is added to this address tag of m bits, and it is input to the tag memories 11–1n as the address tags 641–64n to which the first valid bit was added.

In the logic gates OR91–9n, a logical sum is applied to the register output signal 600 with the write signals 331–33n, and it is output as the output signals 621–62n. At this time, out of the output signals 621–62n, signals output from active ones of the write signals 331–33n have a valid logic value 1, and signals output from inactive ones have an invalid logic value 0.

A logical product is applied to the output signals 621–62n in the logic gates AND101–10n, and the first valid bits 631–63n to be input to the tag memories 11–1n are generated. At this time, the first valid bit for any one of the tag memories 11–1n, which was selected by the write signal 330, shows validity and has a logic value 1. Other first valid bits for the tag memories 11–1n, which were not selected by the write signal 330, show invalidity (has a logic value 0, for example).

In the logic gates OR111–11n, a logical sum is applied to the write signals 331–33n corresponding to each way of the tag memories 11–1n with inversion signals of the output signals 621–62n, and they are output as the write signals 651–65n (time $t_6$). The write signals 651–65n that were output show validity (have a logic value 1, for example) in case that the address tag and the valid bit can be written into each way. By determining the way in which the write signals 651–65n become valid, a way into which the writing is conducted is selected, and the address tags 641–64n to which the first valid bit of (m+1) bits was added are written.

In addition, the index signal 300 is input to one of the tag memories 11–1n. Thereby, a set into which the address tags 641–64n are written is determined, to which the first valid bit was added, and the address tags 641–64*n* to which the first valid bit was added is written into a set of blocks corresponding to a way which performs a writing operation by means of the write signal 330.

Also, when the address tag and the first valid bit are written into the selected tag memories, the second valid bit is written into the valid bit register 2 in synchronization with a clock. In the valid bit register 2, as a result of decoding the index signal 300 of n bits, one valid bit memory is selected out of the $j=2^k$ valid bit memories 21–2*j*, and in the selected valid bit memory, the valid bit signal 321 of 1 bit is stored in synchronization with a clock.

As mentioned above, by means of the flash of the valid bit register 2, the clear of the second valid bit can be performed. When the flash signal 340 becomes active, all valid bit registers are reset at 1 clock, and store a logic vale 0 that shows invalidity. And, the first valid bits stored in the tag memories 11–1*n* are cleared other than a set into which an address is written, and a logic value 0 that shows invalidity is written thereinto. This writing is conducted (time $t_7$) after the address tags 641–64*n* to which the first valid bit was added are input to the tag memories 11–1*n*, and further, the write signal 651–65*n* is input to start writing.

After the flash of the valid bit register 2, even in case that the first valid bits 661–66*n* output from the tag memories 11–1*n* have a logic value 1 that shows validity, if the second valid bit 670 stores a logic value 0 that shows invalidity, the valid bits 361–36*n* become a logic value 0 of invalidity. In other words, regardless of the validity/invalidity of the first valid bits, in case that the second valid bit 670 shows invalidity, the valid bits 361–36*n* of each way show invalidity (a logic value 0).

After the flash, in performing the writing into the tag memories 11–1*n*, since all of the second valid bits are invalid (a logic value 0), the register output signal 600 from the valid bit register 2 becomes 0. And, in the writing into the tag memories 11–1*n*, all of the write signals 330 of n bits are not 0, and in the selected way, the write signals 331–33*n* become valid (a logic value 1). Accordingly, the output signals 621–62*n* output from the logic gates OR91–9*n* become a logic value 0, and thereby, the first valid bits 631–63*n* to which a logical product was applied in the logic gates AND101–10*n* and which was output show invalidity (logic value of which becomes 0).

And, the write signals 651–65*n* to the memory, to which a logical sum was applied in the logic gates OR111–11*n* and which was output, show validity (logic value of which becomes 1), and thereby, a logic value 0 is written into the first valid bit in synchronization with a clock. Accordingly, in the writing of the address tag after the flash, even in case that a logic value 1 is written into the valid bit register, it is possible to transfer to 0 the first valid bit on the tag memory 1 of a way (nonselective way) that was not selected. Thereby, it is possible to clear the first valid bit on the tag memory 1.

As mentioned above, in the cache memory in this embodiment, a singular valid bit register 2 is commonly connected to the plurality of tag memories 11–1*n*. And, the reading and writing of the address tag and the generation of the valid bits 361–36*n* are performed. At this time, the valid bits 361–36*n* are generated from the first valid bits 661–66*n* and the second valid bit 670.

Further, since the valid bit register 2 has the reset means, it is possible to clear all of the second valid bits at the same time at 1 clock, which are stored in the valid bit memories 21–2*j*. Thereby, it is possible to efficiently clear all of the valid bits 361–36*n* at the same time at 1 clock, which is generated from the first valid bits 661–66*n* and the second valid bit 670.

In the cache memory employing such an n-way set associative system, compared with the cache memory employing the conventional n-way set associative system, 1/n can be realized. Accordingly, by providing one valid bit register 2, the circuit scale of the cache memory can be reduced.

And, it is possible to write the address tag into the tag memory 1, and to clear the first valid bit by means of the write signal 330, which is stored in the tag memory 1. Accordingly, without newly providing means for clearing the first valid bit, it is possible to clear the first valid bit. Therefore, it is possible to further reduce the circuit scale of the cache memory.

Since the circuit scale of the cache memory can be reduced in this manner, it is possible to reduce electric power consumption. Also, since the scale of the cache circuit can be reduced and the growing complexity thereof can be avoided, the increase in speed of the cache memory can be realized.

And, after the valid bit register 2 is flashed, and all of the second valid bits are cleared at the same time, all of the valid bits other than the first valid bit in the writing of the address tag can be cleared at the same time. Accordingly, the valid bits can be cleared efficiently, and it is possible to shorten a period of operation time during the clear of the valid bits. Also, since the valid bits can be cleared efficiently and a period of clear operation time can be shortened, it is possible to obtain the cache memory that conducts an operation at high speed.

In addition, although, in this embodiment of the present invention, the cache memory provided between the CPU and the main memory was explained, the present invention can be applied to a disk cache provided between the main memory and an auxiliary memory device. Even in case of applying it to the disk cache, the reduction of the circuit scale of the disk cache, the reduction of electric power consumption, and the speeding-up of the disk cache can be realized. Further, by using it for both of the cache memory and the disk cache, the reduction of the electric power consumption and the speeding-up of an entire computer can be realized.

According to the present invention, it is possible to provide the cache memory and the control method thereof capable of performing the clear operation efficiently, and reducing the circuit scale.

What is claimed is:

1. A cache memory employing a set associative system, for generating a valid bit for showing presence of validity of a cache data, comprising:
   a storage for storing an address tag of an address of a cache data and a first valid bit for showing presence of validity of said cache data in a set of blocks in response to an index; and
   reset means for storing a second valid bit corresponding to said first valid bit, and resetting said second valid bit, wherein said valid bit is generated based on the first valid bit and the second valid bit.

2. A cache memory recited in claim 1, wherein said valid bit shows validity in case that both of the first valid bit and the second valid bit show validity, and shows invalidity in case that either the first valid bit or the second valid bit shows invalidity.

3. A cache memory recited in claim 1, wherein said reset means is common to each way.

4. A cache memory recited in claim 1, wherein, in case that said reset means resets the second valid bit, said first valid bit is cleared via write means for writing the first valid bit into the storage.

5. A cache memory recited in claim 4, wherein said first valid bit is selectively cleared via the write means.

6. A control method of controlling a reset of a cache memory employing a set associative system, for generating a valid bit for showing presence of validity of a cache data, comprising:
   storing an address tag of an address of a cache data and a first valid bit for showing presence of validity of said cache data in a set of blocks in response to an index;
   storing a second valid bit in response to said index;
   resetting said second valid bit; and
   generating said valid bit based on said first valid bit and said second valid bit.

7. A control method recited in claim 6, wherein said valid bit shows validity in case that both of the first valid bit and the second valid bit show validity, and shows invalidity in case that either the first valid bit or the second valid bit shows invalidity.

8. A control method recited in claim 6, wherein, in case that the second valid bit is reset, the address tag and the first valid bit are stored and said first valid bit is cleared.

9. A control method recited in claim 8, wherein said first valid bit is selectively cleared.

10. A cache memory employing a set associative system, for generating a valid bit for showing presence of validity of a cache data, comprising:
    a storage that stores an address tag of an address of a cache data and a first valid bit that shows presence of validity of said cache data in a set of blocks in response to an index; and
    a reset unit that stores a second valid bit corresponding to said first valid bit, and resets said second valid bit,
    wherein said valid bit is generated based on the first valid bit and the second valid bit.

11. A cache memory recited in claim 10, wherein said valid bit shows validity in case that both of the first valid bit and the second valid bit show validity, and shows invalidity in case that either the first valid bit or the second valid bit shows invalidity.

12. A cache memory recited in claim 10, wherein said reset unit is common to each way.

13. A cache memory recited in claim 10, wherein, in case that said reset unit resets the second valid bit, said first valid bit is cleared via a write unit that writes the first valid bit into the storage.

14. A cache memory recited in claim 13, wherein said first valid bit is selectively cleared via the write unit.

* * * * *